United States Patent [19]

Kertis

[11] Patent Number: 5,046,050

[45] Date of Patent: Sep. 3, 1991

[54] SHARED BICMOS SENSE AMPLIFIER

[75] Inventor: Robert A. Kertis, Puyallup, Wash.

[73] Assignee: National Semiconductor Corporation, Santa Clara, Calif.

[21] Appl. No.: 506,972

[22] Filed: Apr. 10, 1990

[51] Int. Cl.[5] ............................................ G11C 11/40
[52] U.S. Cl. .................................. 365/208; 365/177; 307/530
[58] Field of Search .................. 365/230.03, 207, 208, 365/177, 189.07; 307/530

[56] References Cited

U.S. PATENT DOCUMENTS 4,596,001  6/1986  Baba ...................... 365/207

Primary Examiner—Joseph A. Popek
Attorney, Agent, or Firm—Townsend and Townsend

[57] ABSTRACT

A switching circuit for SRAM memory cells is disclosed. The circuit electronically decouples input lines to sense amplifiers from unselected arrays of memory cells. The decoupling results in a large decrease in the amount of parasitic capacitance that the selected inputs would encounter.

10 Claims, 2 Drawing Sheets

SHARED BICMOS SENSE AMPLIFIER

BACKGROUND OF THE INVENTION

1. Field of the Invention

This invention is in the field of Static Random Access Memories ("SRAM"). Specifically, it relates to a technique for coupling a single sense amplifier to the memory cells on both sides of the memory array without incurring capacitance penalties.

2. Description of the Relevant Art

SRAM memories are well known. Such memories comprise an array of memory cells and associated addressing and detection peripheral circuits. Although the size of the array is arbitrary, using current fabrication techniques, a million or more memory cells can be formed on a single chip.

One such memory cell is shown in FIG. 1. Transistors $T_1$, $T_2$, $T_3$, and $T_4$ form a bistable cross-coupled flip-flop circuit, and transistors $T_5$ through $T_8$ form the gating network through which the interior nodes A and B of the flip-flop circuit are coupled to the One-bit line and the Zero-bit lines. Transistors $T_5$ and $T_6$ form an AND gate, as do transistors $T_7$ and $T_8$. For a random access memory, X and Y address signals are applied for coincident selection of the appropriate memory cell. A linear-selection scheme can also be used, in which case transistors $T_6$ and $T_8$ are omitted and the X address line represents the word line.

In a quiescent state both the X and Y address lines are at ground potential, isolating the memory flip-flop from both bit lines. If $T_2$ is assumed to be ON, and $T_1$ off, node A is at $V_{dd}$ and node B at 0 V. To read the cell, both address lines are pulsed (negative for P-channel MOS devices), which turns on transistors $T_5$ through $T_8$. Current will then flow into the One-bit line, which is kept at $V_{dd}$ by transistors $T_7$ and $T_8$ and transistor $T_2$, which is ON. Little or no current flows through the Zero-bit line, which is also kept at $V_{dd}$ as transistor $T_1$ is off. The state of the memory cell is thus determined by detecting on which bit line the sense current flows.

As SRAMs comprise so many essentially identical elements, it is convenient and known to arrange the individual memory cells symmetrically in the integrated circuit. FIG. 2 shows one common pattern. In known fashion, address decoding allows only one cell to be written or read at a given time. The output from that particular cell appears on the Zero- and One-bit lines.

In very large SRAM memories, more efficient use of the integrated circuit's area is achieved by arranging the memory cells in large groups, with the sensing circuitry needed to read the Zero- and One-bit sense lines being placed between the blocks of the cells. One such arrangement is shown in FIG. 3. Each group of memory cells is essentially identical, containing P rows and Q columns of memory cells. Between each pair of groups (12/14, 16/18) is a central area, herein regions 19 and 21, which contains the sensing circuitry for the memory cells on either side of it.

Differential sense amplifiers ('sense amplifiers') are used to read the contents of the individual memory cells. The construction and operation of such amplifiers is known. It is also known to take advantage of the symmetrical arrangement of memory cells used in SRAM memories as shown in FIG. 3 to use a single group of sense amplifiers to read the output signals from memory cells in the blocks to both the left and right side of the central sensing circuitry.

In FIG. 2 the memory cells are designated by a block with a dashed number inside it indicative of the cell location. Thus, cell 1-2 is in row 1, column 2. As shown in FIG. 2, the output lines from the memory cells, the Zero- and One-bit lines, are brought out of the array to the sense amplifier (not shown). Each of the rows in a block of the array is connected to the same sense amplifier, the output of which indicates whether the memory cell in the selected row and column contains a 0 or 1. The buses from both the right and left side blocks are coupled together and in turn connected to the same sense amplifier in the central area. The buses and sense amplifiers are all known technology.

Although known arrangements have successfully reduced the area of the integrated circuit which must be devoted to sensing the contents of the memory cells, they have at least one major operational difficulty. The long buses which are needed to couple the memory cells on either side of the sensing circuitry to the sensing circuitry itself have large undesirable capacitances against which the signal generated by the memory cell must drive. This causes a large, undesirable power drain, and also slows the operation of the memory.

Consequently, there is a need for a sensing circuit which can receive signals from memory cells coupled through long buses to the sensing circuitry without adding unnecessary capacitance to the circuit.

SUMMARY OF THE INVENTION

The present invention provides a sense amplifier coupled to memory cells located in the blocks to the left and right of the amplifier. A side selection circuit detects a signal which indicates on which side a block is being sensed. Upon receipt of this signal, output signals from cells on the unselected side are electronically decoupled from the sense amplifier, while signals from the selected side are amplified and supplied by the sense amplifier to the SRAM output circuitry.

By electronically decoupling the memory cells in the unselected side, the signals from the selected memory cells can reach the sense amplifiers with a minimum of undesired capacitance.

Also, as only one sense amplifier is used to detect and amplify the contents of the memory cells, the output buses over which the contents of the cells are transmitted also have reduced output capacitances as only half the usual number of amplifiers are needed.

Although the present invention will be described in the context of a preferred embodiment realized using BiCMOS fabrication technology, nothing herein should be understood to limit this invention to that particular environment. It could be usefully implemented in any SRAM or DRAM integrated circuit, conditional only on a symmetric arrangement of the memory cells.

The invention will now be described in detail with reference to the following figures.

DETAILED DESCRIPTION OF THE PREFERRED EMBODIMENTS

Figure 1:
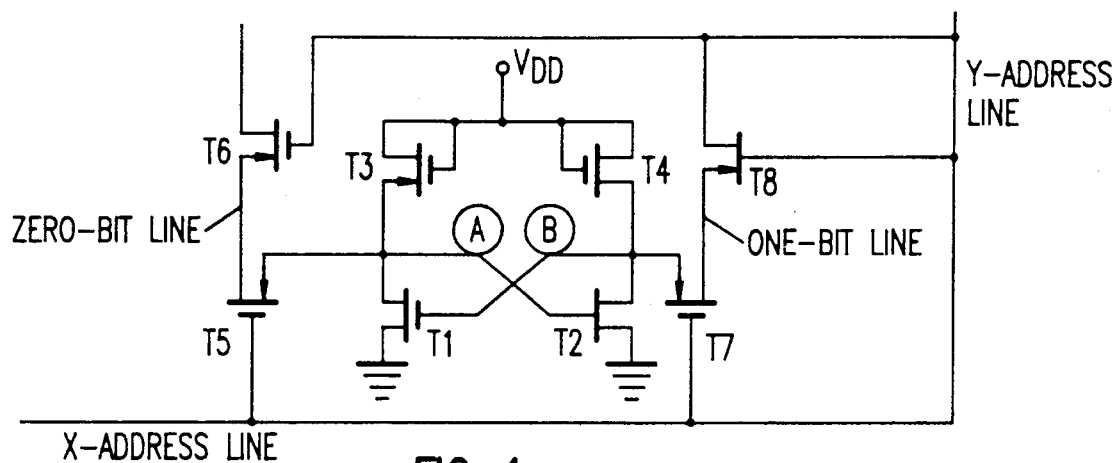
FIG. 1 shows a conventional SRAM memory cell.
Figure 2:
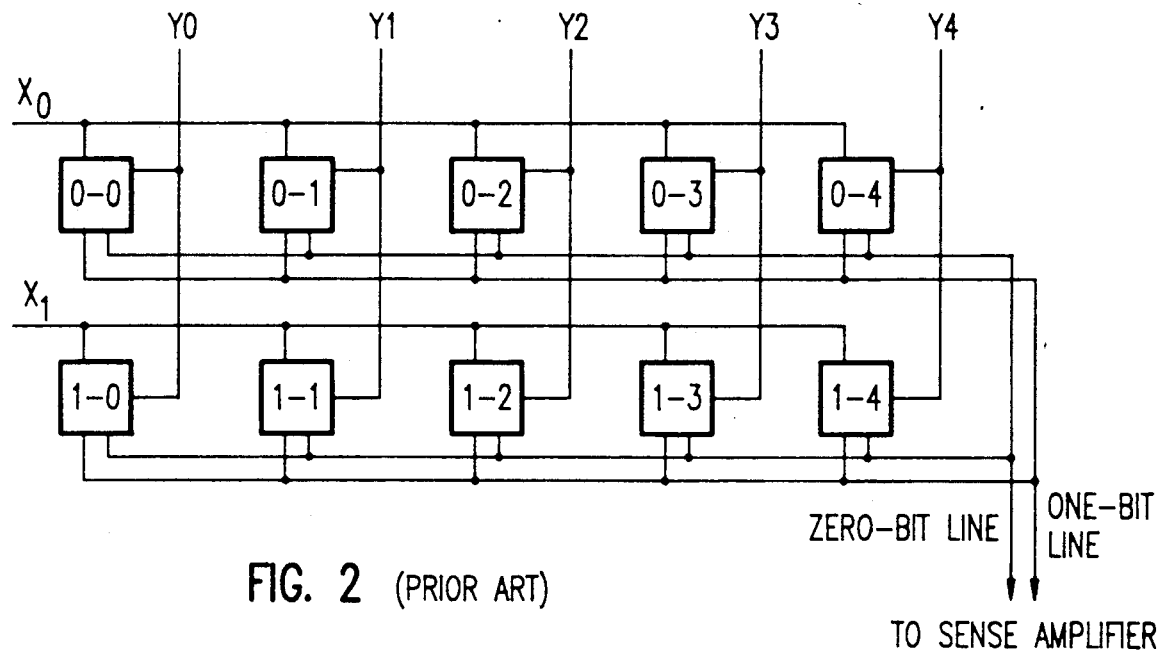
FIG. 2 shows a small section of a conventional SRAM circuit containing a number of memory cells.
Figure 3:
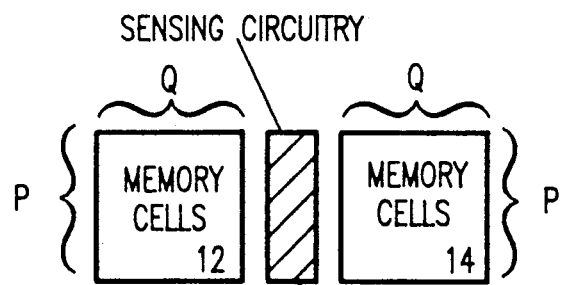
FIG. 3 shows a known arrangement for memory cells and sensing circuitry in an SRAM memory.
Figure 3:
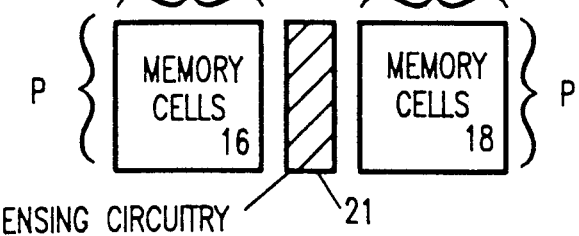
Figure 4:
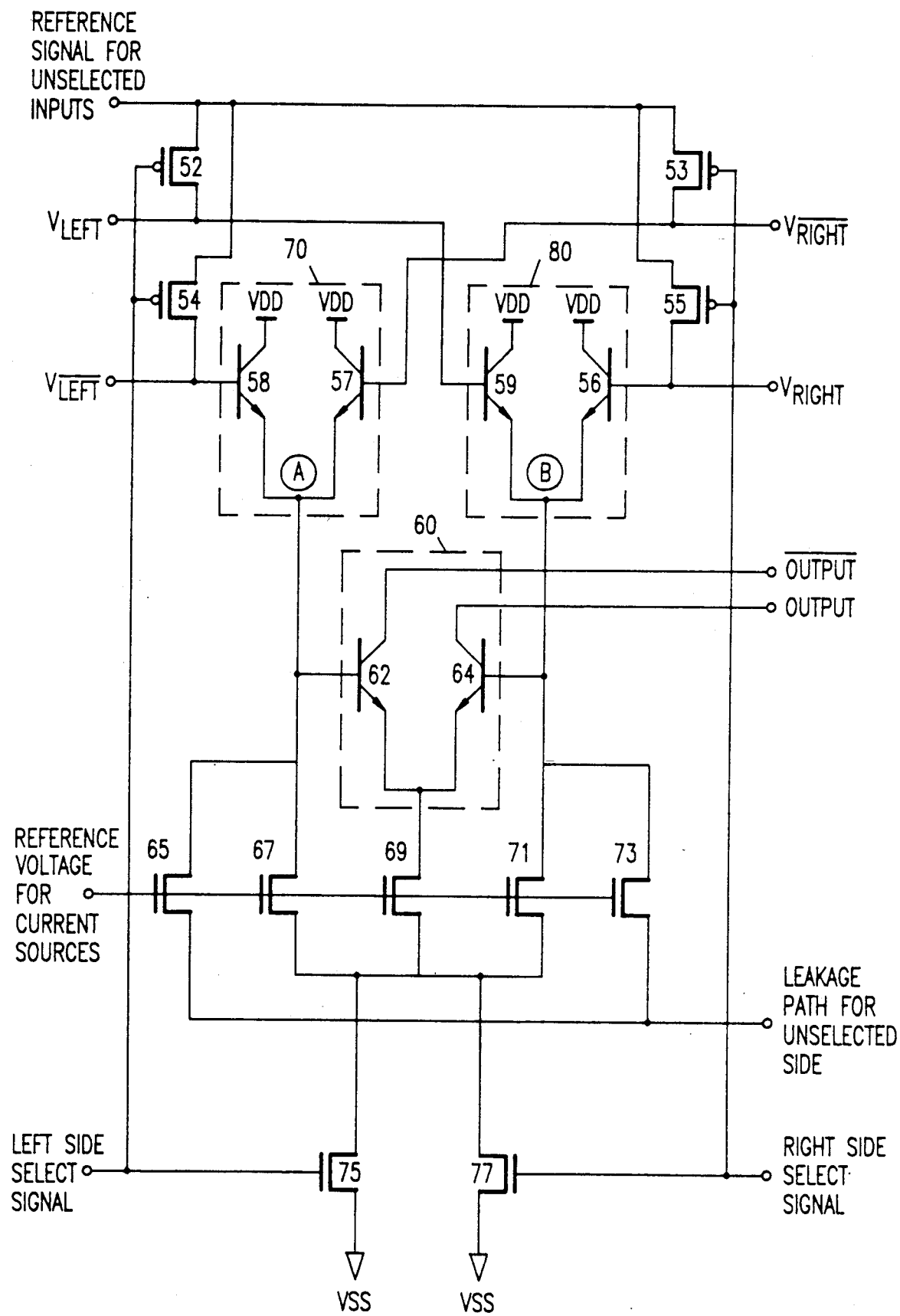
FIG. 4 is a schematic of the present invention.

FIG. 4 is a schematic diagram of a preferred embodiment of a shared BiCMOS sense amplifier according to the present invention. The inputs to the circuit are $V_{left}$ and $\overline{V_{left}}$, the left side memory cell block's true and complement output signals, and $V_{right}$ and $\overline{V_{right}}$, the right side memory cell block's true and complement output signals. The sense amplifier also receives left and right side select input signals for selecting which group of memory cells will provide the input signal to the sense amplifier, a voltage reference signal for the unselected side's input buses, and a voltage reference signal for the MOS current sources. The outputs from the circuit of FIG. 4 are the true output ("Output") and its complement ("$\overline{Output}$"), as well as a leakage path for the nonselected side.

Sense amplifier 60, comprised of transistors 62 and 64, provides the OUTPUT and $\overline{OUTPUT}$ output signals. Depending upon which side of the memory array is selected, sense amplifier 60 receives its input from $V_{left}$ and $\overline{V_{left}}$ or $V_{right}$ or $\overline{V_{right}}$. In turn, the initial selection of these input signals is controlled by two wired OR logic gates, 70 and 80, comprised respectively of transistors 57 and 58 and 56 and 59. $\overline{V_{left}}$ and $\overline{V_{right}}$ are the input signals to the bases of transistors 59 and 56, respectively, and $V_{left}$ and $V_{right}$ are the input signals to the bases of transistors 58 and 57, respectively. The emitters of transistors 58 and 57, as well as the emitters of transistors 59 and 56 are coupled together and connected to the bases of transistors 62 and 64, respectively.

Transistors 67 and 71 act as current sources and are coupled to the output nodes of wired OR circuits 70 and 80, respectively. Current source 69 is coupled to the emitters of transistors 62 and 64. Transistors 75 and 77 act as switches and their gates are coupled to the left and right side select input signals, respectively, and their sources are coupled to the drains of current sources 67, 69, and 71.

Transistors 67, 69, and 71 provide the current sources for differential sense amplifier 60 as well as for the transistors 56 through 59, which form the wired OR circuits 70 and 80. Transistor 69 provides roughly a milliamp of current while the emitter follower current sources (transistors 67 and 71) provide approximately 200 $\mu A$. Transistors 67, 69, and 71 have been chosen to act as ideal constant current sources rather than resistors to insure a steady current through the OR gates and sense amplifier even if the voltage across the transistors varies. Emitter follower nodes A and B are held low when the circuit is not being used through transistors 65 and 73 and the leakage path output.

For purposes of this description, the operation of this circuit will be discussed using a left side select command as an example. The operation of the circuit is reversed when a right side select command is received.

Upon receipt of a left side select signal, which is active high, transistor 75 is turned on and conducts current. In turn this permits current flow through current source transistors 67, 69, and 71. The same left side select signal also turns off transistors 52 and 54, which are PMOS transistors and inactive when their gates are high. When transistors 52 and 54 turn off, this disconnects the left side differential input lines $V_{left}$ and $\overline{V_{left}}$ from the reference voltage signal. Because the right side select signal is off (low), transistors 53 and 55 are on, bringing the unselected input lines $V_{right}$ and $\overline{V_{right}}$ to approximately $V_{dd}-0.4$ V, the reference voltage for unselected inputs. This voltage is a lower voltage than that appearing on the $V_{left}$ and $\overline{V_{left}}$ input lines.

Once transistors 52 and 54 become inactive, left side differential input signals $V_{left}$ and $\overline{V_{left}}$ appear on the bases of transistors 58 and 59, which transistors respectively form one base of wired OR logic circuits 70 and 80. The reference voltage for unselected input lines appears on the bases of transistor 56 and 57, the other transistors in wired OR circuits 70 and 80. Given the configuration of the OR circuits, $V_{left}$ and $\overline{V_{left}}$ turn on transistors 59 and 58, respectively, with transistors 56 and 57 not conducting.

Left side differential input signals $V_{left}$ and $\overline{V_{left}}$ now appear on the inputs to sense amplifier 60, the bases of transistors 62 and 64, after a single $V_{BE}$ drop across transistors 58 and 59. The differential between these signals then causes one of the two outputs Output or $\overline{Output}$ to go high indicating whether the sensed cell was a 1 or 0.

The operation of the circuit is reversed if the right side select were chosen. If neither side is selected, all input lines are shorted to the reference voltage, and there is no current flow. As indicated, when one or the other side is selected, wired OR logic circuits 70 and 80 effectively decouple the other side from the sense amplifier. Therefore, the input signals do not see the capacitances on the opposite sides.

In addition to eliminating the input capacitance of the unselected input signal lines, the arrangement suggested herein for a single sense amplifier to detect the contents of both a right and left memory cell block also allows for the reduction of output parasitic capacitances by one-half. This follows naturally from the fact that only one amplifier is coupled to the output lines, instead of a separate right and left side sense amplifier, the two amplifiers each being coupled to a single output signal bus.

Although this invention has been described in the specific environment of a BiCMOS SRAM, the invention would be equally useful in other SRAMs implemented with other technologies and in dynamic RAM. The specific current and voltage values, as well as specific types of transistors described herein could also be altered without changing the present invention in any essential way. Therefore, this specification should not be read in a narrow, restrictive sense, but rather in a broad inclusive one. The scope of the invention is set forth in the following claims.

We claim:

1. In a static random access memory ("SRAM") comprising a power supply, at least a right group and a left group of SRAM memory cells, each group of cells having at least an output signal, complement output signal, an output signal line, and a complement output signal line, a group select circuit and a sense amplifier, the group select circuit selecting which group of SRAM memory cells is to provide its output signal and complement output signal to the sense amplifier, the group select circuit and sense amplifier comprising:

right and left side switching networks coupled respectively to the right and left groups output signal line and complement output signal line, the switching networks having side select inputs and at least one switching network output;

a first and second OR gate, coupled to the right and left side switching networks outputs, each OR gate having two OR input lines and at least one OR output line; and the sense amplifier, having two sense amplifier input lines and two sense amplifier output lines, the input lines being coupled to the output lines of the first and second OR gates, wherein when a side select input signal is received, the selected switching network transmits the selected side's output signal and complement output signal to one OR input of each OR gate respectively, the unselected switching network simultaneously applying a reference voltage to the other input of the OR circuits, the output of the OR gates being applied to the inputs of the sense amplifier, the sense amplifier then generating an output signal determined by the input signals' sense amplifier's voltage differential.

2. The circuit and sense amplifier of claim 1 wherein the right and left side switching networks each comprise two PMOS transistors, the transistors having gates, sources and drains, the gates of the left side switching network being coupled to a left side select signal line, the gates of the right side switching network being coupled to a right side select signal line, the sources of the left and right side switching networks being coupled to a reference voltage line, the drains of the left side switching network being coupled to the left side output signal line and the left side complement output signal line, respectively, and the drains of the right side switching network being coupled to the right side output signal line and the right side complement output signal line, respectively.

3. The current and sense amplifier of claim 2, wherein the first and second OR gates comprise two bipolar junction transistors each, the transistors each having a base, emitter, collector, the collectors of each transistor being coupled to the SRAM power supply, the bases of the transistors comprising the first OR gate being coupled to the left and right side complement output signal lines, respectively, the bases of the transistors comprising the second OR gate being coupled to the right and left side output signal lines, respectively, the emitters of the first OR gate being coupled together and to the first sense amplifier input line, and the emitters of the second OR gate being coupled together and to the second sense amplifier input line.

4. The circuit and sense amplifier of claim 3 wherein the sense amplifier comprises two bipolar junction transistors, having collectors, bases and emitters, the collectors forming the output signal line and the complement output signal line, respectively, the bases being coupled to the first and second OR gates emitters, respectively, and the emitters being coupled together and to a ground voltage.

5. The circuit and sense amplifier of claim 4 wherein the emitters of the OR gates and the bases of the sense amplifier are respectively coupled to a first and second current source, and the emitters of the sense amplifier are coupled to a third current source.

6. The circuit and sense amplifier of claim 5 wherein the right and left switching networks each further comprise a third NMOS transistor having source, gate and drain, the sources being coupled to each of the current sources, the gates being coupled respectively to the left and right side select signal lines, and the drains being coupled to a ground voltage.

7. The circuit and sense amplifier of claim 6 wherein the current sources are comprised of NMOS transistors having gates, sources, and drains, the gates all being coupled to the reference voltage, the drains being coupled to the sources of the third NMOS transistors of the right and left side switching networks, the source of the first current source being coupled to the emitters of the first OR gate and the base of the first transistor of the sense amplifier, the source of the second current source being coupled to the emitters of the second OR gate and the base of the second transistor of the sense amplifier, and the source of the third current source being coupled to the emitters of the first and second transistor of the sense amplifier.

8. A memory system comprising:
a first block of memory cells having a first output and first complement output;
a second block of memory cells having a second output and second complement output;
first logic means coupled to the first block of memory cells and controllably connectable to a source of reference signals in response to a first select signal for connecting the first output and first complement output to the reference signals and in response to a second select signal for connecting the first output and first complement output to a logic output;
second logic means coupled to the second block of memory cells and controllably connectable to the source of reference signals in response to the first select signal for connecting the second output and second complement output to the logic output and in response to a second select signal for connecting the second output and second complement output to the reference signals; and
a detection means coupled to each of the first and second logic means for detecting the logic output of one of the first and second logic means.

9. A method for detecting the contents of a memory cell in an array of memory cells, the array having a detecting means, the cells being arranged in groups of memory cells and coupled to the detecting means, the method comprising:
selecting one group of memory cells;
decoupling electronically the nonselected groups of memory cells from the detecting means; and
detecting the contents of one of the memory cells in the selected group of memory cells.

10. A circuit for detecting the contents of a memory cell in an array of memory cells, the memory cells being arranged in groups in memory cells, the circuit comprising:
selection means for selecting which of the memory cells will be detected;
detection means coupled to the groups of memory cells and the selection means for detecting the contents of the selected memory cell; and
decoupling means coupled to the detection means and the groups of memory cells for decoupling the unselected groups of memory cells from the detection means.

* * * * *